United States Patent
Nishiura et al.

(10) Patent No.: US 6,250,539 B1
(45) Date of Patent: Jun. 26, 2001

(54) WIRE BONDING METHOD

(75) Inventors: Shinichi Nishiura, Fussa; Tooru Mochida, Higashiyamato, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/408,889

(22) Filed: Sep. 29, 1999

(30) Foreign Application Priority Data

Sep. 30, 1998 (JP) .................................................. 10-276695

(51) Int. Cl.[7] .......................... B23K 31/00; B23K 31/02
(52) U.S. Cl. .................... 228/180.5; 228/179.1; 228/180.1
(58) Field of Search ........................... 228/180.5, 179.1, 228/180.1

(56) References Cited

U.S. PATENT DOCUMENTS

| | | | |
|---|---|---|---|
| 4,340,166 | * 7/1982 | Bilane et al. | 228/179 |
| 4,422,568 | * 12/1983 | Elles et al. | 228/111 |
| 4,597,522 | * 7/1986 | Kobayashi | 228/179 |
| 5,370,300 | * 12/1994 | Okumura | 228/180.5 |
| 5,516,029 | * 5/1996 | Grasso et al. | 228/180.5 |
| 5,685,476 | * 11/1997 | Miyoshi | 228/180.5 |
| 5,776,786 | * 7/1998 | Nakamura et al. | 437/8 |
| 6,112,974 | * 9/2000 | Nishiura et al. | 228/180.5 |

FOREIGN PATENT DOCUMENTS

| | | |
|---|---|---|
| 56-142646 | * 11/1981 | (JP) . |
| 356162847 | * 12/1981 | (JP) . |
| 358056346 | * 4/1983 | (JP) . |
| 10242195 | * 9/1988 | (JP) . |
| 363257237 | * 10/1988 | (JP) . |

* cited by examiner

Primary Examiner—Patrick Ryan
Assistant Examiner—Zidia T. Pittman
(74) Attorney, Agent, or Firm—Koda & Androlia

(57) ABSTRACT

A method, which is for forming accurate low wire loop shapes or short wire loop shapes which are stable and which have a high shape retention force in devices in which height differences between first and second bonding points are small and the wiring distance is short, including the steps of bonding a ball formed at the end of the wire extending out of the capillary to the first bonding point, raising the capillary while delivering the wire, moving the capillary toward the second bonding point, and then raising the capillary diagonally upward.

4 Claims, 5 Drawing Sheets

WIRE BONDING METHOD

BACKGROUND OF THE INVENTION

1. Field of the Invention

The present invention relates to a bonding method and more particularly to a wire bonding method which is suitable for devices in which the height difference between the first and second bonding points is small and the wiring distance is short.

2. Prior Art

FIGS. 4(a) and 4(b) show prior art semiconductor device assembly bonding processes.

In these processes, a pad 2a (which is a first bonding point) on a semiconductor chip 2 mounted on a lead frame 1 and a lead 1a (which is a second bonding point) on the lead frame 1 are connected by a wire 3; and FIG. 4(a) shows a triangular wire loop (of the bonded wire 3), and FIG. 4(b) shows a trapezoidal wire loop.

These bonding processes are disclosed in, for example, Japanese Patent Application Laid-Open (Kokai) No. H4-318943 and Japanese Patent Application Publication (Kokoku) Nos. H1-26531, H5-60657 and H6-101490.

In particular, Japanese Patent Application Laid-Open (Kokai) No. H4-318943 discloses both triangular and trapezoidal loops in FIG. 3 and in column 1, lines 31 through 41. Japanese Patent Application Publication (Kokoku) No. H1-26531 discloses a triangular wire loop in FIG. 3(c) and in column 3, line 3 through line 25. Japanese Patent Application Publication (Kokoku) No. H5-60657 discloses a triangular wire loop in FIG. 2(e) and in column 3, line 30 through column 4, line 40. Japanese Patent Application Publication Kokoku) No. H6-101490 discloses a trapezoidal wire loop in FIG. 1 and in column 4, lines 39 through column 5, line 22.

The triangular loop of FIG. 4(a) is formed by the process shown in FIG. 5(a) and FIG. 6. As seen from FIG. 5(a), a capillary is moved from point A to G through points B, C and F to form the triangular wire loop.

More specifically, as shown in FIG. 6, in step (a), the capillary 4 is lowered with a clamper (not shown) which holds the wire 3 maintained in an open state, and a ball formed on the tip end of the wire 3 is bonded to the first bonding point A, after which the capillary 4 is raised to point B, delivering the wire 3. Next, in step (b), the capillary 4 is moved horizontally to point C in the opposite direction from the second bonding point G. A loop forming operation in which a capillary is moved in the opposite direction from a second bonding point is generally called a "reverse operation". As a result of this reverse operation, the wire 3 assumes a shape that is inclined from point A to point C, and a kink 3a is formed in one portion of the wire 3. The wire 3 delivered in this process and extending from point A to point C forms a neck height part 31 shown in FIG. 4(a).

Next, in step (c), the capillary 4 is raised to point F, delivering the wire 3; and the clamper (not shown) is closed. When the clamper is closed, no wire 3 is delivered from the capillary 4 even if the capillary 4 is subsequently moved. Next, in step (d), the capillary 4 is positioned at the second bonding point G by being moved circularly or by being lowered after a circular-arc movement, thus bonding the wire 3 to the second bonding point G.

On the other hand, the trapezoidal loop shape shown in FIG. 4(b) is formed by the process shown in FIG. 5(b) and FIG. 7. As seen from FIG. 5(b), the capillary is moved from point A to G through points B, C, D, E and F.

More specifically, as shown in FIG. 7, in step (a), the capillary 4 is lowered with the clamper (not shown) which holds the wire 3 maintained in an open state, and the ball formed on the tip end of the wire is bonded to the first bonding point A, after which the capillary 4 is raised to point B, delivering the wire 3. Next, in step (b), the capillary 4 is moved horizontally to point C in the opposite direction from the second bonding point G. As a result, the wire 3 assumes a shape that is inclined from point A to point C, and a first kink 3a is formed in one portion of the wire 3. The wire 3 delivered in this process and extending from point A to point C forms the neck height part 31 shown in FIG. 4(b).

Next, in step (c), the capillary 4 is raised to point D, delivering the wire. Afterward, in step (d), the capillary 4 is again moved horizontally to point E in the opposite direction from the second bonding point G, i. e., a reverse operation is performed. As a result, the wire 3 assumes a shape that is inclined from point C to point E, and a second kink 3b is formed in one portion of the wire 3. The wire 3 delivered and extends from point C to point E forms the trapezoidal length part 32 shown in FIG. 4(b).

Next, in step (e), the capillary 4 is raised to point F, delivering an amount of wire 3 that forms the inclined part 33 shown in FIG. 4(b); and the clamper (not shown) is closed. When the clamper is closed, no further wire 3 is delivered even if the capillary 4 is subsequently moved. Next, in step (f), the capillary 4 is positioned at the second bonding point G by being moved circularly or by being lowered after a circular-arc movement, thus bonding the wire 3 to the second bonding point G.

The triangular loop formation process shown in FIG. 5(a) and FIG. 6 is advantageous in that the loop can be formed by a simpler process than the trapezoidal loop formation process shown in FIG. 5(b) and FIG. 7, and the loop formation is accomplished in a shorter time. However, in cases where the height difference between the first bonding point A and the second bonding point G is large, or in cases where the first bonding point A and the end portion of the semiconductor chip 2 are separated from each other by a considerable distance, the wire 3 contacts the semiconductor chip 2 if the wire is in the triangular loop shape as shown in FIG. 4(a). In such cases, contact between the wire 3 and the semiconductor chip 2 is prevented by using the trapezoidal loop shape as shown in FIG. 4(b).

As seen from the above, either a triangular loop or a trapezoidal loop is selected depending on the conditions involved. However, in the case in which the height difference between the first bonding point A and the second bonding point G is small (e.g., 100 μm or less), and the wiring distance is short (e.g., 1 mm or less), problems arise when a low wire loop shape or short wire loop shape is made by the triangular loop formation process or the trapezoidal loop formation process. In particular, in cases where the amount of reverse movement in the reverse operation is sufficient so that a kink 3a is strongly formed in the wire 3 as shown in FIG. 6(b) and FIG. 7(b), an accurate triangular loop or trapezoidal loop can be formed as shown in FIG. 6(d) and FIG. 7(f); however, in cases where a low wire loop shape is to be formed, a large amount of reverse movement cannot be performed because the neck height part 31 must be low.

A wire shape in which a triangular wire loop formation process forms a low neck height part 31 is shown in FIG. 8, while a wire shape by a trapezoidal wire loop formation process that forms a low neck height part 31 is shown in FIG. 9.

In these cases, as shown in step (b) in FIG. 8 and in step (b) in FIG. 9, the kink 3a formed in steps (c) in FIGS. 6 and 7 cannot be obtained sufficiently, and a bent part 3c is formed in step (c) in FIGS. 8 and 9. As a result, a triangular loop or trapezoidal loop with an inaccurate shape which is bowed upward is formed and the overall height of the wire loop is increased in step (d) in FIG. 8 and in step (i) in FIG. 9.

Unfortunately, when the wire is formed with a bend in it initially or when a bend is formed in the wire during the wire loop forming operation, there is no way for removing such bends. As a result, bends and bows are generated in the bonded wires.

SUMMARY OF THE INVENTION

Accordingly, the object of the present invention is to provide a wire bonding method which makes it possible to form accurate low wire loop shapes and short wire loop shapes that are stable and that have a high shape retention force for devices which have a small height difference between first and second bonding points and which have a short wiring distance.

The above object is accomplished by unique steps of the present invention which are taken in a wire bonding method in which a wire that passes through a capillary is connected between a first bonding point and a second bonding point by the capillary; and in the present invention, the capillary is raised while the wire is delivered from the tip end of the capillary after a ball formed on the tip end of the wire extending from the tip end of the capillary has been bonded to the first bonding point, the capillary is then moved toward the second bonding point, and then the capillary is subsequently raised directly upward or upward along an inclined path.

The above object is further accomplished by unique steps of the present invention which are taken in a wire bonding method in which a wire that passes through a capillary is connected between a first bonding point and a second bonding point by the capillary; and in the present invention, the capillary is raised while the wire is delivered from the tip end of the capillary after a ball formed on the tip end of the wire extending from the tip end of the capillary has been bonded to the first bonding point, the capillary is then moved toward the second bonding point, and the capillary is subsequently raised directly upward or upward along an inclined path, and further, the capillary is lowered to a position which is above the second bonding point but located slightly on the first bonding point side of the second bonding point, the capillary is then moved to a point directly above the second bonding point, and then the capillary is lowered so that the wire is bonded to the second bonding point.

In the above methods, the direction in which the capillary is raised when the capillary is raised upward along an inclined path is a direction that is more or less oriented along the chamfer surface of the capillary.

DETAILED DESCRIPTION OF THE PREFERRED EMBODIMENTS

One embodiment of the present invention will be described with reference to FIGS. 1 and 2.

Figure 1:
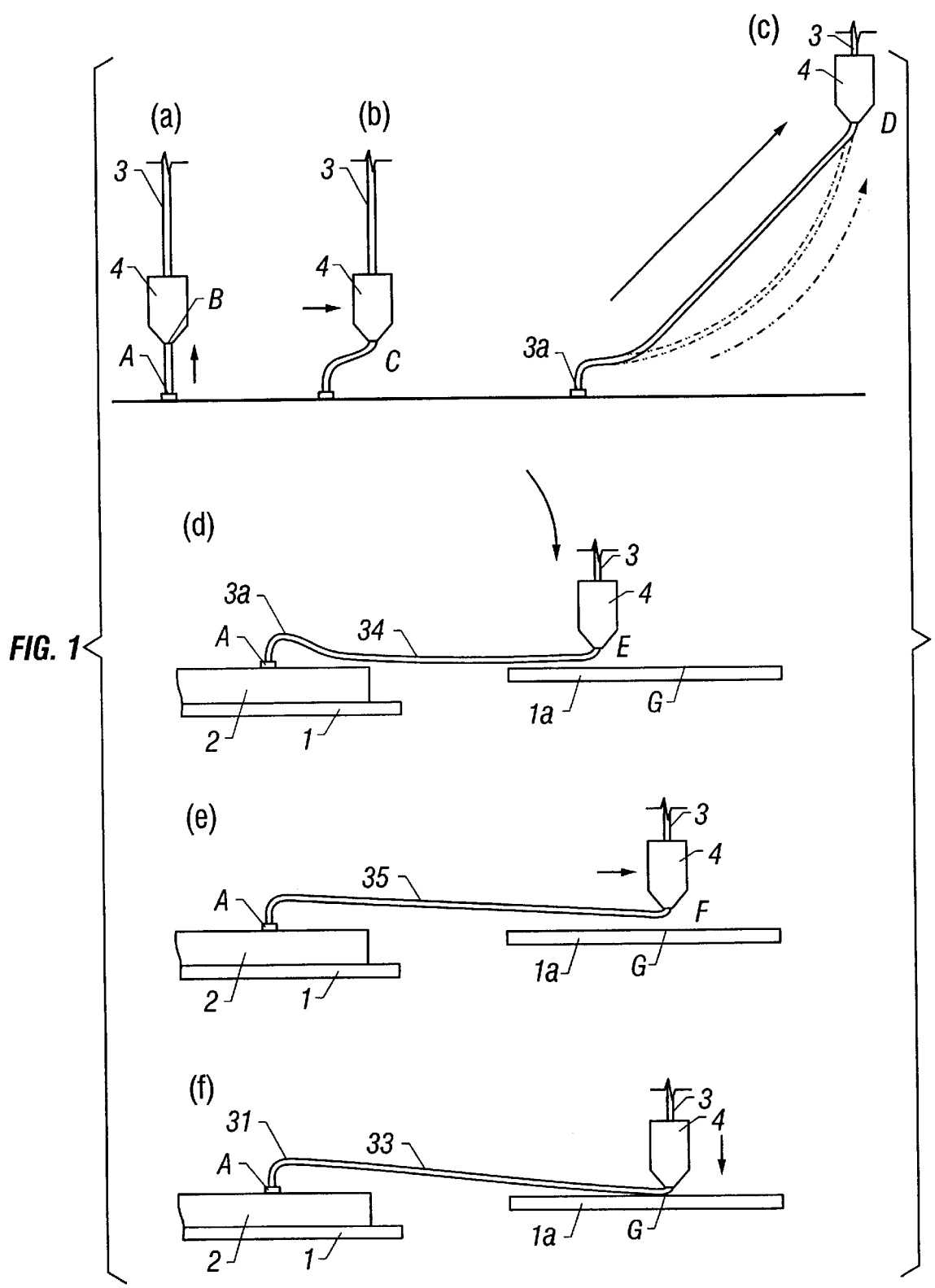
FIG. 1 illustrates one embodiment of the wire bonding method according to the present invention, comprising the steps (a) through (f)
Figure 2:
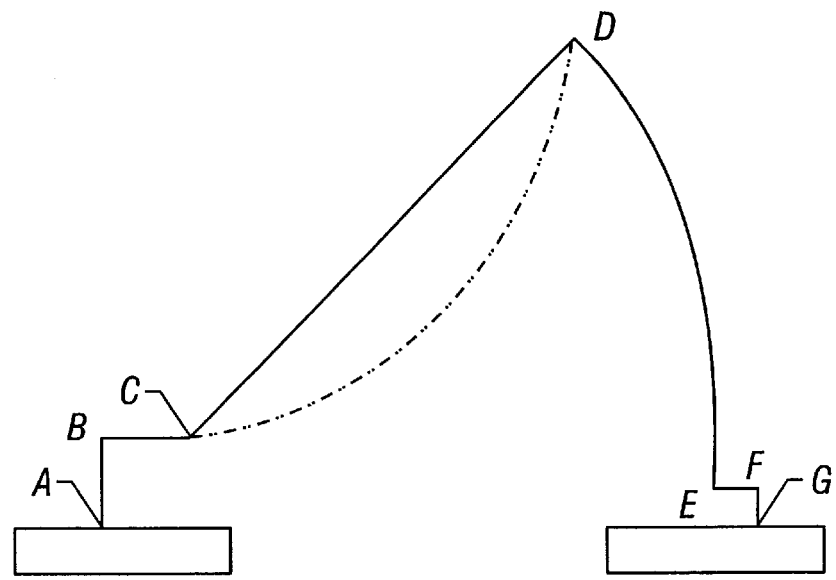
FIG. 2 is an explanatory diagram which shows the track of the capillary in the steps shown in FIG. 1.

First, in step (a) shown in FIG. 1, which is the same as that used in a conventional method, is performed. In other words, the capillary 4 is lowered with a clamper (not shown) that holds the wire 3 maintained in an open state, and the ball formed on the tip end of the wire 3 is bonded to the first bonding point A. After this, the capillary 4 is raised to point B, delivering the wire 3.

Next, the process that characterizes the present embodiment is performed.

In step (b), the capillary 4 is moved from point B to point C in the direction of the second bonding point G. As a result, a kink 3a is formed in one portion of the wire 3. The wire 3 delivered during the movement of the capillary 4 from point A to point C will form the neck height part 31 shown in step (f).

Next, in step (c), the capillary 4 is raised from point C to point D along a path that is inclined upward in the direction of the second bonding point G, delivering the wire 3. The length of wire 3 that is delivered out in this operation from point C to point D will form the inclined portion 33 shown in step (f). It is desirable that the track along which the capillary 4 is raised from point C to point D be a linear track as indicated by the solid line arrow or a circular-arc track as indicated by the two-dot chain line arrow. The reasons for this will be described with reference to FIGS. 3(a) and 3(b).

Figure 3A:
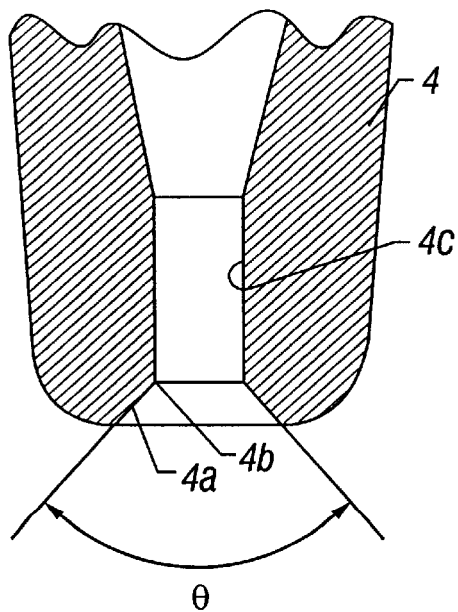
FIG. 3(a) is a sectional view of the capillary used in the present invention.

As shown in FIG. 3(a), the capillary 4 is formed with a chamfer surface 4a, a corner edge 4b and a hole 4c. The corner edge 4b is where the chamfer surface 4a joins with the hole 4c. Depending on the type of capillary 4 used, the capillary 4 may have a rounded corner edge 4b, or it may have a chamfer surface 4a that is formed in a multiple number of steps. The embodiment is described with reference to the commonly used type of capillary shown in FIG. 3(a) which has a rounded corner edge. Generally, the chamfer angle $\theta$ formed by the chamfer surface 4a is about 90° to 120°.

Figure 3B:
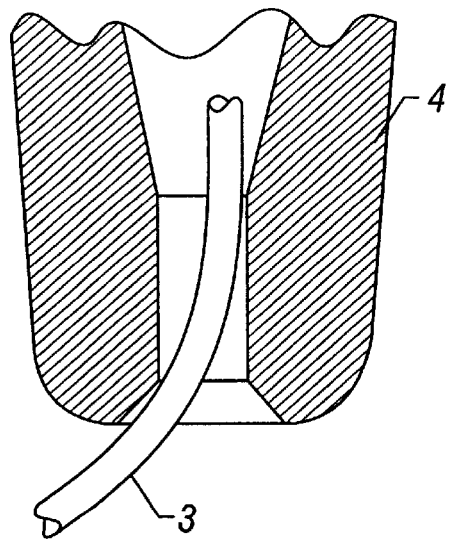
FIG. 3(b) is an explanatory sectional view of the capillary, showing the relationship between the capillary and the wire that passes through the capillary.
Figure 4A:
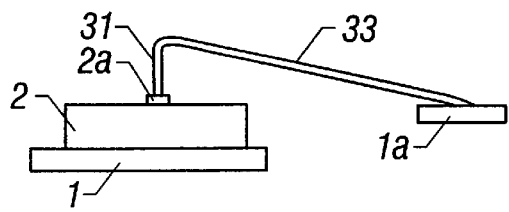
FIG. 4(a) shows the wire loop shape of a conventional triangular loop.
Figure 4B:
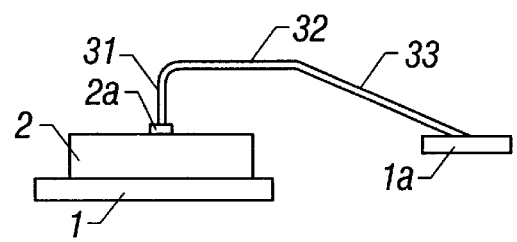
FIG. 4(b) shows the wire loop shape of a conventional trapezoidal loop.
Figure 5A:
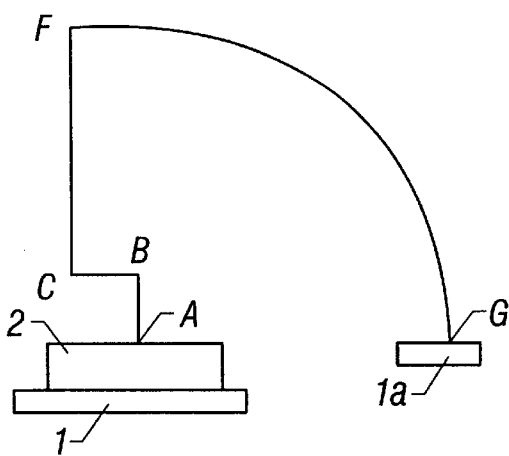
FIG. 5(a) shows the track of a capillary to form the conventional triangular loop.
Figure 5B:
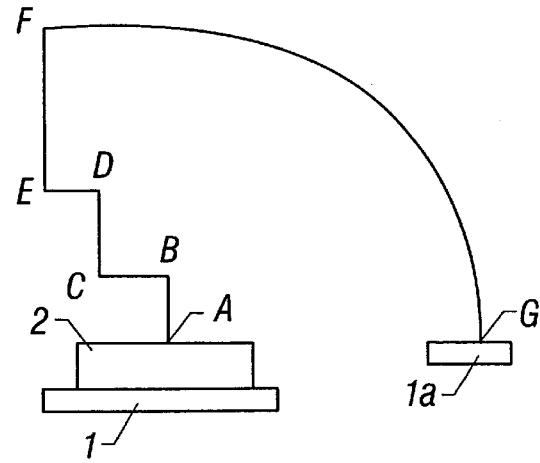
FIG. 5(b) shows the track of a capillary to form the conventional trapezoidal loop.
Figure 6:
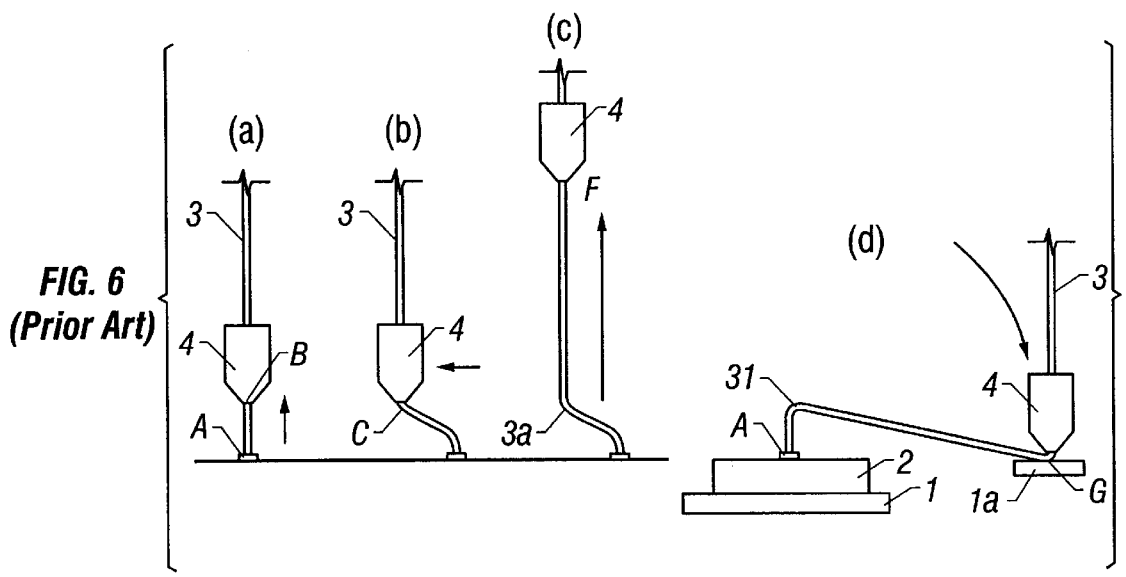
FIG. 6 shows the steps (a) through (d) for forming the triangular wire loop of FIG. 5(a)
Figure 7:
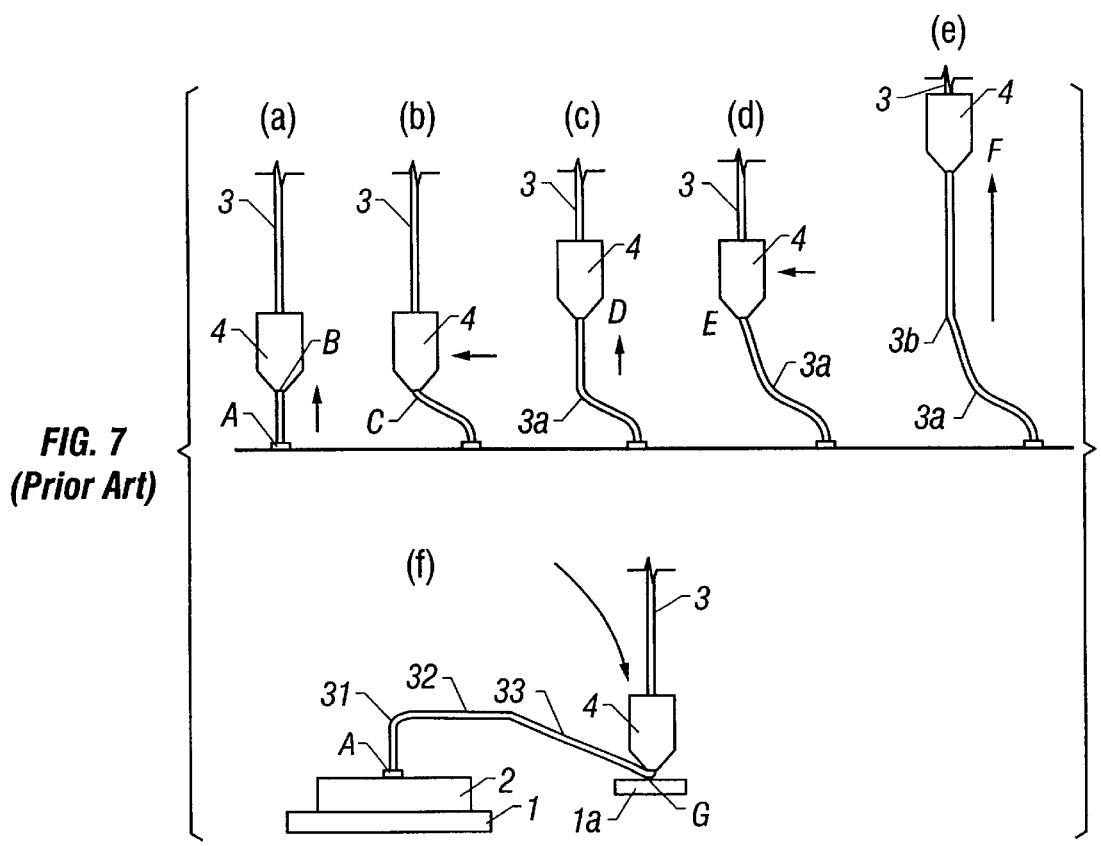
FIG. 7 shows the steps (a) through (f) for forming the trapezoidal wire loop of FIG. 5(b)
Figure 8:
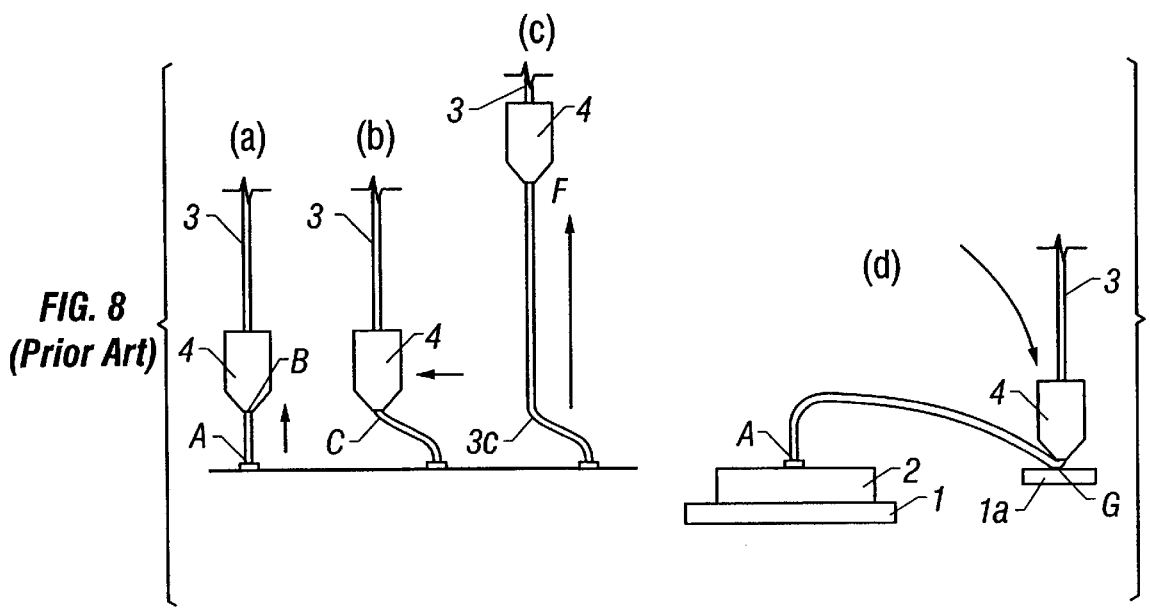
FIG. 8 shows the steps (a) through (d) in which the amount of reverse movement of the capillary is insufficient in the process of forming the conventional triangular loop.
Figure 9:
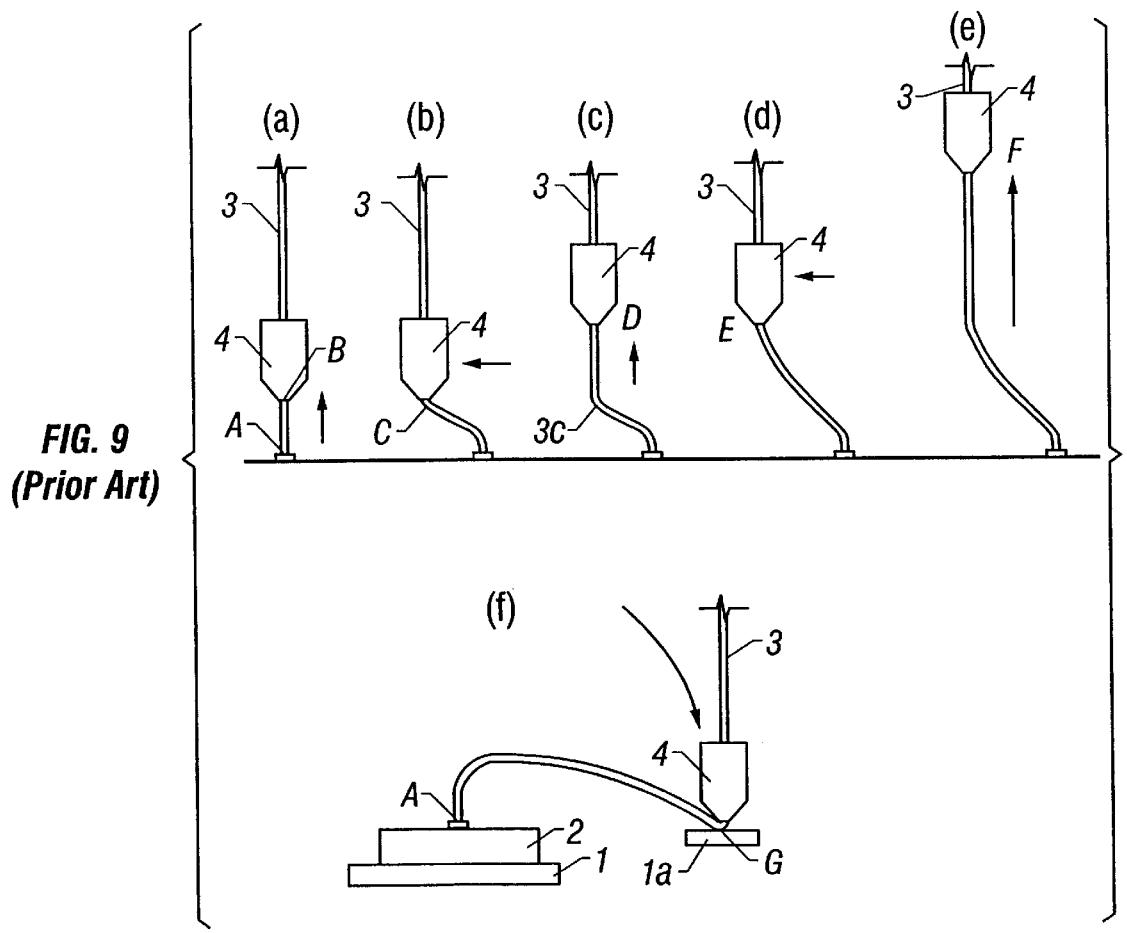
FIG. 9 shows the steps (a) through (f) in which the amount of reverse movement of the capillary is insufficient in the process of forming the conventional trapezoidal loop.

When the wire 3 is delivered, the wire 3 contacts the chamfer surface 4a and corner edge 4b as shown in FIG. 3(b); and as a result, the wire 3 is rubbed by the corner edge 4b, and any bend or kink in the wire 3 can be removed. Since no stress should be applied to the wire 3 after the removal of such bends or kinks, it is desirable that the chamfer surface 4a be more or less oriented along the wire 3. Thus, by moving (or raising) the capillary 4 along the direction of the chamfer surface 4a, the wire 3 is rubbed; and any bend and kink formed in the wire 3 during bonding or after bonding is removed.

After the step (c) in FIG. 1 is completed, the clamper (not shown) is closed. When the clamper is closed, no further wire 3 is delivered out even if the capillary 4 should subsequently move.

Next, in step (d), the capillary 4 is positioned at point E by being caused to perform a circular-arc movement or by being caused to perform a circular-arc movement, and then lowered.

Furthermore, in step (e), the capillary 4 is moved to point F which is slightly above the second bonding point G. As a result of this movement from point E to point F, the wire 3 is stretched so that tension is applied to the wire 3, thus causing the downward bow of the wire shape 34 formed in step (d) to be absorbed, thus forming a wire shape 35 with an ideal wire length.

Finally, in step (f), the capillary 4 is lowered and positioned at the second bonding point G, and the wire 3 is bonded thereto.

The operation of the capillary from point D to point E and the operation from point F to the second bonding point G have no direct connection with the gist of the present invention; therefore, it goes without saying that operations similar to those disclosed in the prior art may be performed or operations of various other types may be performed. However, by taking the step (e) to move the capillary from point E to F as in the present invention, an ideal wire shape 35 is obtained as described above.

In step (c) shown in FIG. 1, the capillary 4 is raised upward along an inclined path; however, it is also possible to simply raise the capillary 4 directly upward. However, by raising the capillary 4 along an inclined path as in the shown embodiment, the wire 3 is rubbed as described above, and bends and kinks in the wire 3 during bonding or after bonding can be removed.

As seen from the above, according to the present invention, after the ball at the tip end of the wire extending from the tip end of the capillary has been bonded to the first bonding point, the capillary is raised, delivering the wire; and then the capillary is moved toward the second bonding point and is raised directly upward or upward along an inclined path. Accordingly, accurate low wire loop shapes or short wire loop shapes which are stable and which have a high shape retention force can be formed in devices in which the height difference between the first bonding point and the second bonding point is small and in which the wiring distance is short.

What is claimed is:

1. A wire bonding method in which a wire that passes through capillary is connected between a first bonding point and a second bonding point by the capillary, consisting of the steps of:

raising the capillary to deliver the wire from a tip end of the capillary after a ball formed on a tip end of the wire extending from a tip end of the capillary has been bonded to the first bonding point, moving the capillary toward the second bonding point while delivering wire from the tip end of the capillary, and raising the capillary directly upward or upward along an inclined path while delivering wire from the capillary.

2. A wire bonding method in which a wire that passes through a capillary is connected between a first bonding point and a second bonding point by the capillary, consisting of the steps of:

raising the capillary to deliver the wire from a tip end of the capillary after a ball formed on a tip end of the wire extending from a tip end of the capillary has been bonded to the first bonding point, moving the capillary toward the second bonding point while delivering wire from the tip end of the capillary, raising the capillary directly upward or upward along an inclined path while delivering wire from the tip end of the capillary, stopping the delivery of wire from the tip end of the capillary, lowering the capillary to a position which is above the second bonding point but located slightly on the first bonding point side of the second bonding point, moving the capillary to a point directly above the second bonding point, and lowering the capillary to bond the wire to the second bonding point.

3. The wire bonding method according to claim 1, wherein the direction in which the capillary is raised when the capillary is raised upward along the inclined path is a direction that is substantially oriented along a chamfer surface formed in the capillary.

4. The wire bonding method according to claim 2, wherein the direction in which the capillary is raised when the capillary is raised upward along the inclined path is a direction that is substantially oriented along a chamfer surface formed in the capillary.

* * * * *